United States Patent [19]

Perlmutter et al.

[11] Patent Number: 5,214,383
[45] Date of Patent: May 25, 1993

[54] MRI APPARATUS WITH EXTERNAL MAGNETIC FIELD COMPENSATION

[75] Inventors: Robert J. Perlmutter, Palo Alto; Brian P. Wilfley, Los Altos; Rick Motamedi, Sunnyvale; John Moberly, Mountain View, all of Calif.

[73] Assignee: Resonex, Inc., Sunnyvale, Calif.

[21] Appl. No.: 778,305

[22] Filed: Oct. 16, 1991

Related U.S. Application Data

[63] Continuation-in-part of Ser. No. 605,787, Oct. 29, 1990, abandoned.

[51] Int. Cl.$^5$ ............................................. G01R 33/20
[52] U.S. Cl. ..................................... 324/313; 324/300
[58] Field of Search ............... 324/300, 307, 309, 318, 324/322; 128/653.2, 653.5

[56] References Cited

U.S. PATENT DOCUMENTS

| | | | |
|---|---|---|---|
| 3,609,519 | 9/1971 | Seki et al. | 324/313 |
| 3,774,103 | 11/1973 | Laukien | 324/313 |
| 3,873,909 | 3/1975 | Ernst | 324/307 |

OTHER PUBLICATIONS

"Development of MRI System with Permanent Magnet" by Yanaka et al, based on 3rd Japanese-French Biomedical Technologies Symposium, May 5-7, 1989 in Himeji, Japan.
Preprint of Paper entitled "A Superconductive Solenoid System which Cancels Fluctuations in the Ambient Magnetic Field" in the name of Gabrielse et al, submitted to the Journal of Magnetic Resonance.

Primary Examiner—Michael J. Tokar
Attorney, Agent, or Firm—Flehr, Hohbach, Test, Albritton & Herbert

[57] ABSTRACT

External field compensation is provided for MRI apparatus which is in a magnetically noisy environment such as that caused by nearby subway trains. By means of a magnetometer type sensor, the external field fluctuation is sensed and after being adjusted for the filtering effect of the magnet structure of the MRI device itself, the master oscillator of the MRI device is adjusted to compensate for the external field fluctuation. Alternatively the current of the magnet coil is adjusted.

10 Claims, 3 Drawing Sheets

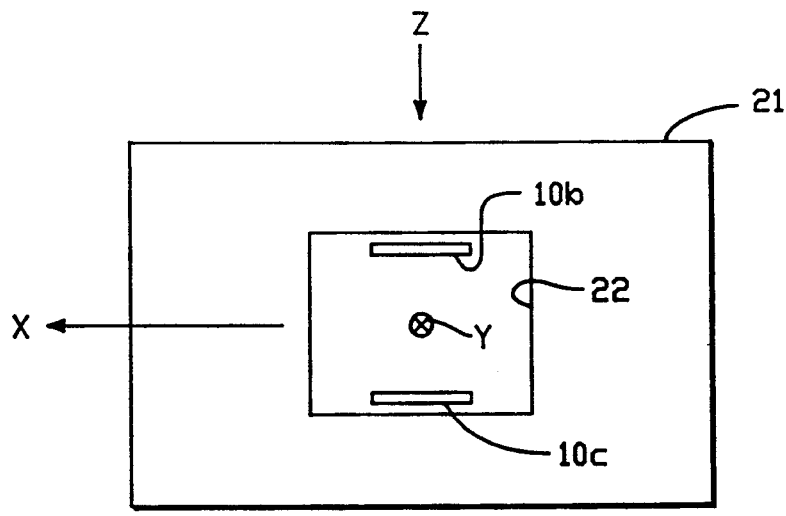
FIG.—4
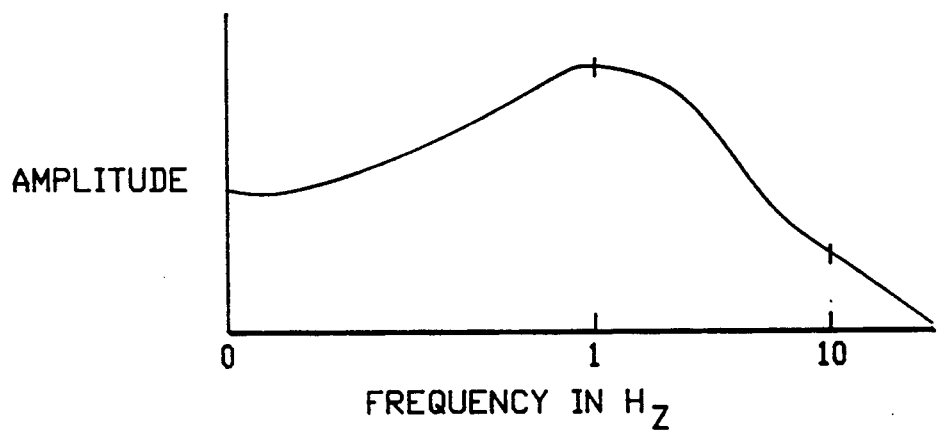
FIG.—5
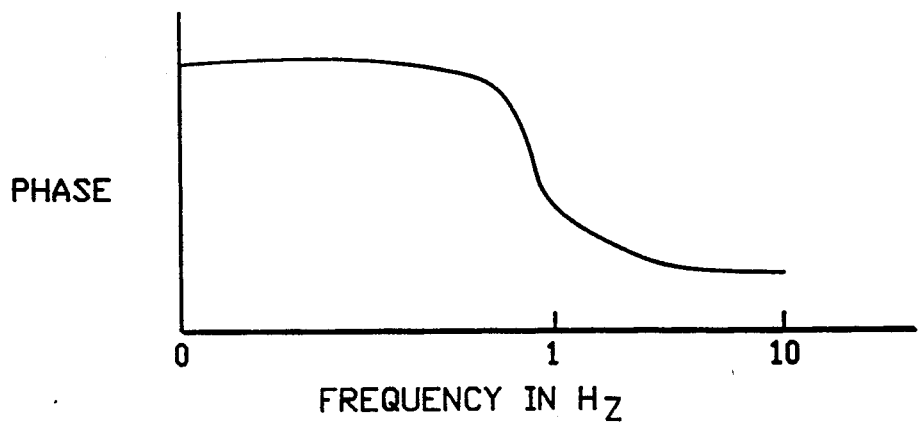
FIG.—6

MRI APPARATUS WITH EXTERNAL MAGNETIC FIELD COMPENSATION

CROSS REFERENCE TO RELATED APPLICATION

This is a Continuation-in-Part of a patent application filed Oct. 29, 1990, Ser. No. 07/605,787, in the names of Robert J. Perlmutter, Brian P. Wilfley, Rick Motamedi and John Moberly, entitled MRI APPARATUS WITH EXTERNAL MAGNETIC FIELD COMPENSATION and now abandoned.

BACKGROUND OF THE INVENTION

Magnetic resonance imaging (MRI) requires a stable magnetic field. Such fields are provided by iron core resistive electromagnets, superconducting magnets and permanent magnets. In various urban settings fluctuating magnetic fields produced by electric powered subways or other sources can interfere with the imaging process. The fluctuations can act as a source of a varying (unstable) magnetic field during imaging.

One of the approaches which has been taken in the past involves magnetically shielding the MRI system from the external field by using a magnetic shielding material. A similar approach uses a shorted superconducting coil. While these can be very effective they tend to be costly and sometimes difficult to install.

Another approach has been to use a magnetic field sensor to detect the external field and use its signal to control current flowing through loops of wire configured to produce a magnetic field which approximately bucks or cancels the external magnetic field. This approach can be practical but has some limitations. 1) It can require large amounts of power to produce the bucking magnetic field. 2) Its magnetic field couples to the imaging magnet which complicates the circuitry necessary to condition, filter and amplify the sensors output as required to control the current in the bucking coils. 3) The bucking coils can be impractical to install in such a way as to produce a truly bucking field.

OBJECT OF THE INVENTION

The object of this invention is to develop a new approach to mitigating the effects of time varying external magnetic fields for MRI imaging and NMR spectroscopy.

In accordance with the above object there is provided in an NMR apparatus comprised of a magnet and RF probe and RF NMR signal detection system including an oscillator and a sample to be studied which is immersed within the substantially stable field of the magnet a method to compensate for the effects of an external time varying magnetic field superimposed upon the magnetic field comprising the steps of detecting the external time varying magnetic field with at least one of a plurality of sensors. Using the signal from at least one of the sensors controls the frequency or phase of the oscillator so as to track and therefore compensate for the time variation of the strength of the magnetic field in which the sample is immersed, such variation being caused by said external field.

BRIEF DESCRIPTION OF THE DRAWINGS

FIG. 4 is a simplified elevation view taken along line 4—4 of FIG. 3 showing an alternate location of sensors.

FIGS. 5 and 6 are filtering characteristics used in the present invention.

DESCRIPTION OF PREFERRED EMBODIMENTS

Figure 1:
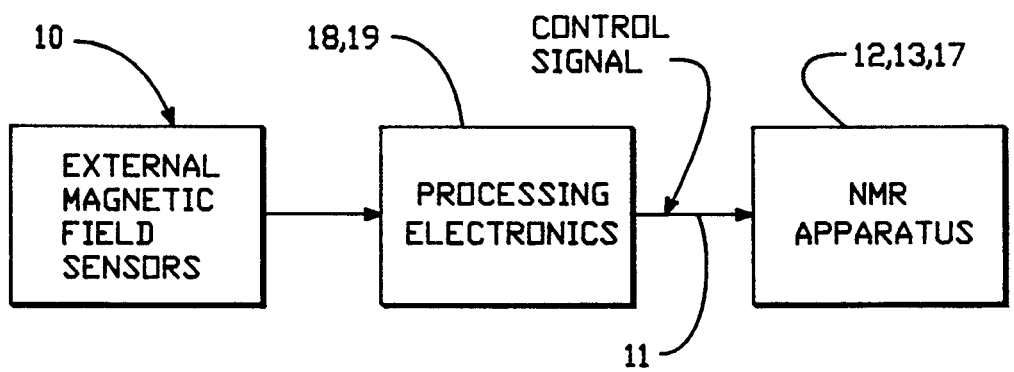
FIG. 1 is a generalized block diagram of an NMR system embodying the present invention.

The first of the new approaches described herein relies on the fact that for the purposes of imaging and spectroscopy the Bloch equations, describing the physics of imaging, imply that there is no difference to the optimum result of an NMR experiment if the main magnetic field and the instrument's master oscillator (used to demodulate the NMR signal) are both extremely stable or if they both vary in time, as long as they track each other accurately. That is, the magnetic field can vary over a narrow range of field strengths ($\pm 100$ ppm); if the master oscillation accurately tracks this variation, then the resulting NMR measurements and reconstructed images are substantially equivalent to images produced when the magnetic field and master oscillator are not varying at all. Therefore we may take advantage of this fact and the fact that modern MRI master oscillators are designed to permit phase continuous frequency modulation.

In this invention one or several magnetometers or sensors 10 senses an external magnetic field and its output 11 controls (RF control 12) the frequency or phase of the MRI system's master oscillator 13 to track the variation of the external field. In a second approach (see dashed line 16, FIG. 2) the magnetometer output on line 11 is used to control the current in the primary windings of the resistive electromagnet 17. This has the advantage that the primary windings are designed to yield a uniform magnetic field.

Figure 2:
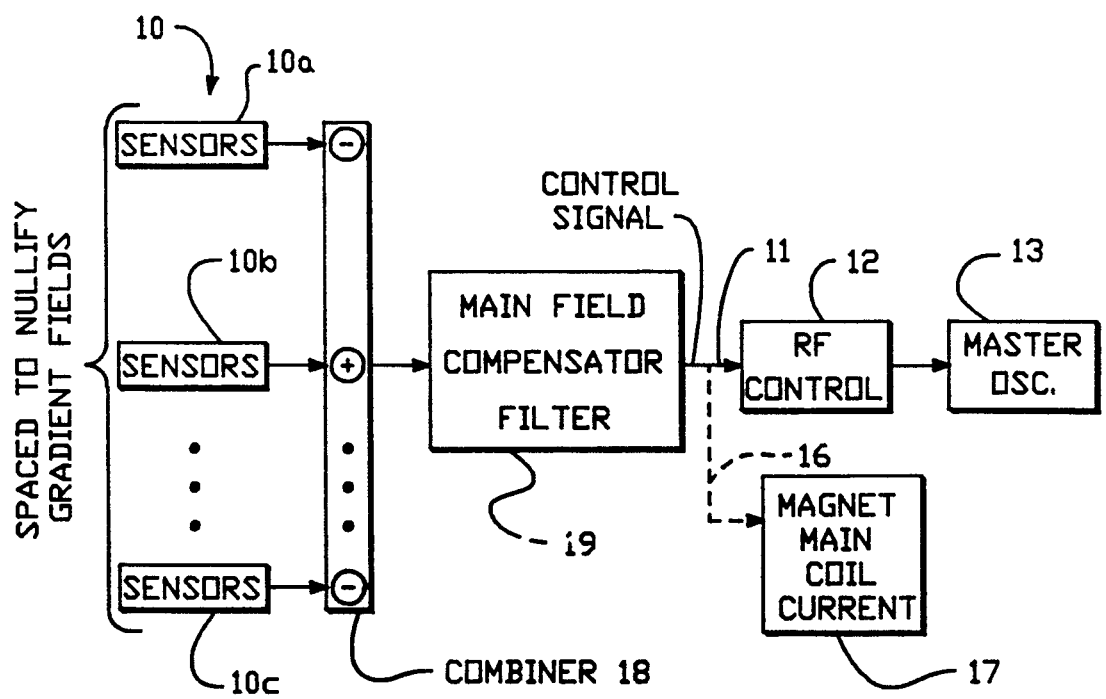
FIG. 2 is a detailed block diagram showing two embodiments.

In both of these approaches the magnetometer or sensor positioning is important. In an MRI system there are intentionally applied time varying magnetic fields in the form of magnetic field gradients. For example in the X, Y and Z directions: see U.S. Pat. Nos. 4,743,851 and 4,741,370. These gradient fields extend beyond the interior of the magnet where the patient lies. In correcting for time varying, external magnetic fields, it is important that the pulsing gradients do not influence the correction signal. Thus by properly positioning (as illustrated in FIG. 2) an array of sensors 10 and combining (in combiner 18) their signals this substantially eliminates the influence of the time varying gradients upon the control signal.

Furthermore the variation of the external magnetic field will be modified or filtered in the interior of the magnet where the patient is. Therefore it is important that the control signal be synthesized from the sensor's outputs utilizing a model of the filter effect which compensates for this effect. The filter model 19 is easily constructed empirically by simulating various known sinusoidal external fields and measuring the effect, in the interior, of the magnet field in order that it may be mimicked.

Thus, FIG. 1 illustrates the general concept of the invention where sensors 10 have their signals processed, in combiner 18 and filter 19, to produce on line 11 a control signal which drives NMR apparatus 12, 13, 17.

Figure 3:
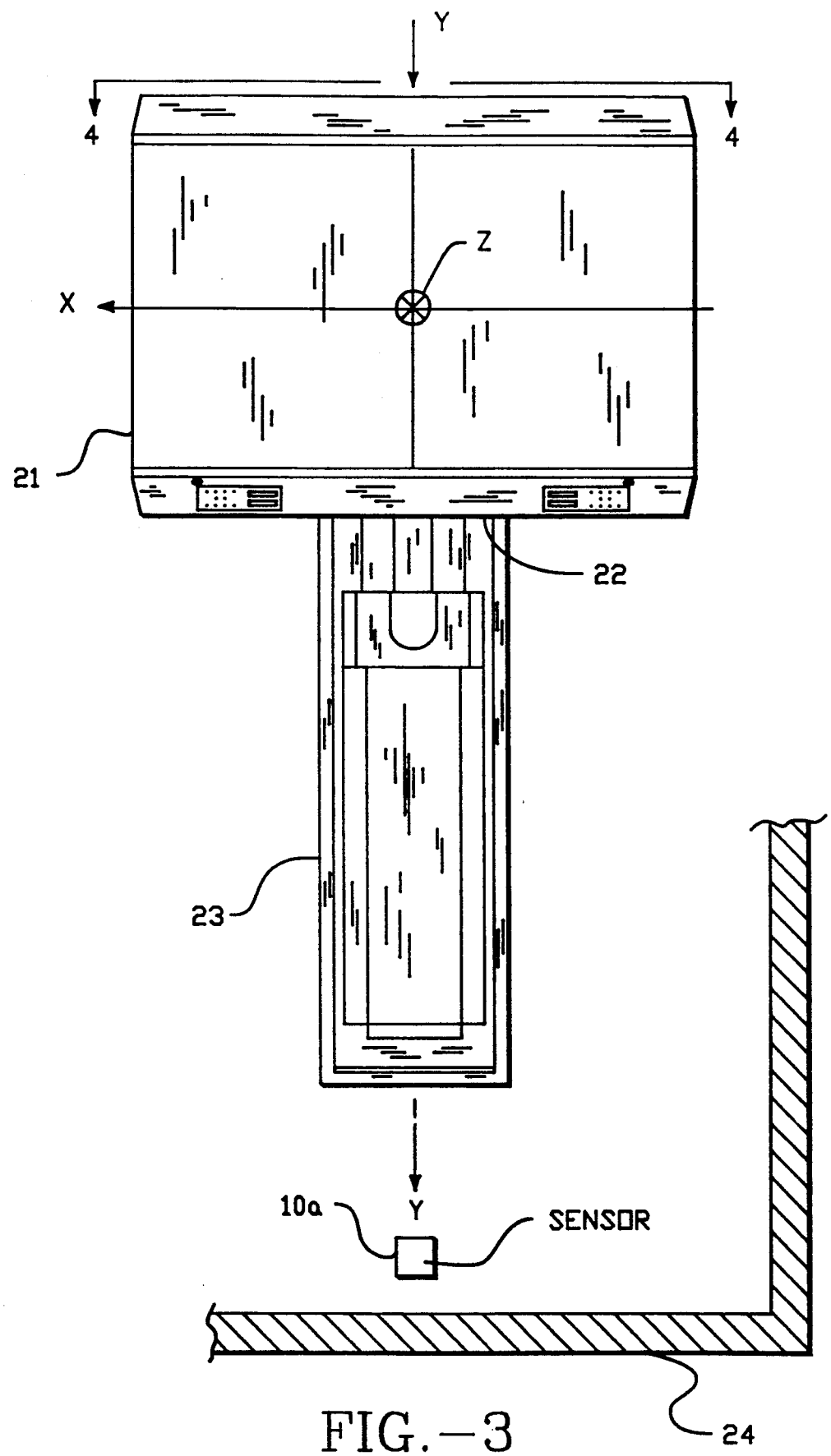
FIG. 3 is a plan view of an installed MRI system illustrating the location of a sensor.

FIG. 3 illustrates a typical magnetic resonance imaging (MRI) machine specifically used for human patients. The main magnet structure is shown at 21 and includes an aperture 22 in which is slidable and movable a patient platform 23. The orthogonal axis of the three magnetic field gradients is shown by the XYZ vectors with the zero point being at the center of structure 21 where the patient or sample to be studied is typically located. In other words, this is the point of zero intensity of the X, Y and Z magnetic field gradients.

In accordance with the invention, a preferred location for a single sensor or magnetometer 10a is at the end of the support platform 23 located on the Y magnetic axis. Thus by definition this sensor is at a zero point for the X and Z fields and the Y field, because the location near where the wall of the room is indicated at 24 where the apparatus is contained, is a minimum.

FIG. 4 shows an alternate location where in the aperture 22 there is provided at the top and the bottom along the line Z axis, sensors 10b and 10c. Thus this sensor pair is located at the zero intensity point of the X and Y magnetic axes and symmetrically spaced on the Z axis to provide cancellation of any Z field gradient. It is obvious, of course, that this pair of sensors may be located in a similar manner on the X axis; but not on the Y axis because of interference with the patient.

FIGS. 5 and 6 illustrate typical empirically derived filter characteristics, FIG. 5 being amplitude versus frequency and FIG. 6 being phase versus frequency of the filter effect of the magnetic structure of the apparatus 21 (FIG. 3). As is obvious from the inspection of these figures, any frequencies greater than 10 Hertz are effectively eliminated so that the filter effect compensation need only begin for frequencies less than 10 Hertz. Typically, a preferred type of filter for this is of the operational amplifier biquad type. Such a filter has the following characteristic $$H(s) = \frac{-ms^2 + cs + d}{s^2 + as + b}$$

In the above equation, m, c, d, a, and b are coefficients of the polynomial quadratic function. "s" is a complex frequency variable. A filter of the above type is described in the Bell Laboratories book published in 1976 by Wylie entitled "Principles of Active Network Synthesis and Design" by Gobind Daryahani. In summary the filter effect is computed for a certain fixed design of the MRI apparatus and thereafter is applicable to all such designs of that type.

Thus, an improved external magnetic field compensation technique for MRI apparatus has been provided.

What we claim is:

1. A method of compensating for the superimposition of an external time varying magnetic field on the main magnetic field produced by the main magnet of a nuclear magnetic resonance (NMR) apparatus, said main magnetic field being normally stable but said superimposed external time varying magnetic field causing time variations in the strength of said main magnetic field, such NMR apparatus including an oscillator having a controllable frequency which is used to demodulate a radio frequency NMR signal received from a sample to be studied which is immersed in said main magnetic field, said method comprising the following steps:

detecting said external time varying magnetic field with at least one of a plurality of sensors which produces a sensor signal related to said external field; and using said sensor signal to control the frequency of said oscillator to track and therefore compensate for said time variation of said strength of said main magnetic field.

2. A method as in claim 1 including the step of filtering said sensor signal so as to mimic the filtering effects said main magnet will have upon the said external varying magnetic field at the location of said sample.

3. A method as in claim 1 where said oscillator has a nominal demodulation frequency and said frequency is controlled to track said time variations of said main magnetic field.

4. A method as in claim 1 where the NMR apparatus includes time varying magnetic filed gradients and the sensors are positioned and their outputs combined so as to minimize the influence of the said time varying gradients upon said sensor signal.

5. A method of compensating for the superimposition of an external time varying magnetic field on the main magnetic field produced by the main magnetic coil of a nuclear magnetic resonance (NMR) apparatus, said main magnetic field being normally stable but said superimposed external time varying magnetic field causing time variations in the strength of said main magnetic field, such NMR apparatus including an oscillator which is used to demodulate a radio frequency NMR signal received from a sample to be studied which is immersed in said main magnetic field, said method comprising the following steps:

detecting said external time varying magnetic field with at least one of a plurality of sensors which produces a sensor signal related to said external field; and using said sensor signal to modify the current in said magnetic coil so the resulting main magnetic field in which said sample is immersed is substantially stable and free of said variations.

6. A method as in claim 5 including the step of filtering said sensor signal so as to mimic the filtering effects said main magnet will have upon the said external varying magnetic field at the location of said sample.

7. A method as in claim 4 in which said sample to be studied is a human body carried by an elongated support platform movable into said main field of said magnet where a single said sensor is spaced from the end of said platform.

8. A method as in claim 4 where said main magnetic field of said magnet may be described by three orthogonal axes and a pair of said sensors are centered on one of said axes but spaced to cancel the field component of that axis and being located at the zero field intensity point of the other two axes.

9. A method as in claim 2 where said filtering is of the operational amplifier biquad type.

10. A method as in claim 2 where said filtering is carried on only for frequencies of less than 10 Hz.

* * * * *